United States Patent [19]
Nagy

[11] Patent Number: 5,840,170
[45] Date of Patent: Nov. 24, 1998

[54] METHOD FOR INHIBITING THE ELECTRODEPOSITION OF ORGANIC PARTICULATE MATTER ON COPPER FOIL

[75] Inventor: Albert E. Nagy, Mentor-on-the-Lake, Ohio

[73] Assignee: Gould Electronics Inc., Eastlake, Ohio

[21] Appl. No.: 982,999

[22] Filed: Nov. 30, 1992

[51] Int. Cl.$^6$ .............................. C25D 5/34; C25D 3/38
[52] U.S. Cl. ............................. 205/101; 205/98; 205/99; 205/291; 205/210; 205/704; 204/DIG. 13
[58] Field of Search .................. 205/205, 210, 205/291, 99, 101, 704, 98; 204/DIG. 13, 141.5; 210/692, 748

[56] References Cited

U.S. PATENT DOCUMENTS

| | | | |
|---|---|---|---|
| 2,563,360 | 8/1951 | Phillips et al. | 204/52 |
| 3,220,897 | 11/1965 | Conley et al. | 148/34 |
| 3,991,017 | 11/1976 | Barrett et al. | 260/2.1 R |
| 4,224,415 | 9/1980 | Meitzner et al. | 521/38 |
| 4,486,313 | 12/1984 | Meitzner et al. | 210/681 |
| 4,501,646 | 2/1985 | Herbert | 205/101 |
| 5,171,417 | 12/1992 | DiFranco et al. | 205/77 |

OTHER PUBLICATIONS

S.E. Afifi, A.A. Elsayed and A.E. Elsherief, "Additive Behavior in Copper Electrorefining", Journal of Metals, Feb., 1987 pp. 38–41. No month available.

E. Henry Chia and Y.Y. Su, "Organic Additives: A Source of Hydrogen in Copper Cathodes" Journal of Metals, Apr. 1987, pp. 42–45. No month available.

T.C. Franklin, "Review: Some Mechanisms of Action of Additives in Electrodeposition Processes", Surface and Coatings Technology, 30, 1987, No month available, pp. 415–428.

N. Ibl, Ph. Javet and F. Stahel, "Note on the Electrodeposits Obtained at the Limiting Current", Electrochimica Acta, 1972, vol. 17, pp. 733–739. No month available.

K. Knuutila, O. Forsen and A. Pehkonen, "The Effect of Organic Additives on the Electrocrystallization of Copper", Helsinki Univ. of Technology, Institution of Process Metallurgy, SF–02150 Espoo, Finland, pp. 129–143 No date available.

*Primary Examiner*—Kathryn L. Gorgos
*Attorney, Agent, or Firm*—D. Peter Hochberg; Mark Kusner; Michael A. Centanni

[57] ABSTRACT

The invention relates to a process for electrolytic treatment of copper foil, comprising the steps of: (A) applying a voltage across an anode and cathode, wherein the anode and cathode are in contact with an electroplating composition containing a gelatin component; (B) removing organic particulate matter by contacting the electroplating solution containing the organic particulate matter with an adsorbent polymer; and (C) electrolytically treating the copper foil. The electroplating composition can additionally contain an active sulfur-containing component, such as thiourea.

9 Claims, 1 Drawing Sheet

METHOD FOR INHIBITING THE ELECTRODEPOSITION OF ORGANIC PARTICULATE MATTER ON COPPER FOIL

FIELD OF THE INVENTION

The present invention relates to method of preparing etchable copper conductive foils useful for preparing printed circuit boards. More specifically, said method provides a copper foil essentially free of organic contaminants.

BACKGROUND OF THE INVENTION

It is a well established practice to electroplate metallic layers, e.g., zinc, brass, bronze, chromium, copper, tin, and the like on such metal substrates as base metals, e.g., stainless steel, and onto metallic foils, e.g., copper, nickel and the like to provide such metal substrates with specific properties, e.g., thermal stability, resistance to oxidation, improved bond strengths, resistance to reaction with organic resins and the like. Metallic foils electroformed from such metals as copper and nickel are widely used in the electronics industry in the production of many electrical devices and circuits, e.g., such as printed circuit boards, integrated circuits, electrical contact surfaces, etc.

Copper foil, in particular, has found widespread use in various applications for the preparation of electronic devices as described above. Metallic layers or treatment layers are commonly plated onto copper foil to provide the foil with specific properties depending upon its ultimate end use. Copper foil used in the production of printed circuit boards are commonly laminated to a substrate of a synthetic resin or the like at elevated temperature and pressure. To form the printed circuit board, the laminate is printed with a pattern of the desired circuit and the unwanted copper foil portions are etched away. Finally, the necessary elements for the electronics are mounted or attached in place by soldering to form the various desired printed circuit boards for electronic devices.

Various qualitative requirements for the copper foil are highly desirable for use in production of printed circuit boards. These requirements vary with the different sides or surfaces of the resin substrate to which the foil is joined (commonly referred to as the "matte side" which generally has a roughened surface) and not joined (commonly referred to as the "shiny side" which has a glossy surface). It is important for the copper foil to be used in the preparation of printed circuit boards to satisfy the requirements for both sides. The major requirements for the matte side are:

1) Avoiding tarnishing, i.e., oxidation, while in storage.
2) Adequate resistance to peel from the substrate even after high-temperature heating, wet treatment, soldering, chemical treatment and the like.
3) Freedom from stains or defect spots after the lamination operation which may result from the laminating process of the foil to the substrate or from the etching process.

The major qualities required for the shiny side include:

1) Quality cosmetic appearance including no tarnishing due to oxidation in storage.
2) Good solder wetability.
3) No oxidative discoloration on heating at elevated temperature.
4) Excellent adhesion to resist materials for producing printed circuits.

In order to meet the foregoing requirements, various different treatments to the surface of the copper foil have been utilized in producing copper foils for printed circuit boards. Some of the treatments will differ depending on whether the copper foils are produced by rolling or by electroforming. Conventional treatments for copper foil will typically involve plating a mixture of copper and copper oxides onto the foil surface. This copper/copper oxide mixture gives satisfactory peel strengths for the various resin substrates commonly used to form the laminate, but will often result in unwanted side effects such as laminate staining and loss of peel strength upon thermal aging or exposure to high temperatures. The laminate staining gives an undesirable discoloration to the copper foil. To overcome these problems the oxides are usually covered up. The "covering up" process involves further processing of the foil in order to cover up the oxides and service discolorations by treating the oxide layer or surface with such metals and alloys as zinc, brass, tin, nickel, indium and pure copper. A typical process of this nature is disclosed in U.S. Pat. No. 3,220,897 to Conley et al.

Treating the matte side of copper foil with a brass layer has become one technique to overcome the problems discussed above. The purpose of the brass layer is to prevent the degradation of the copper/resin bond during printed circuit board processing, and during any subsequent thermal printed circuit board repair or component replacement operations. Moreover, the time and temperature of initial lamination and post-cure (post-bake-stress relieving), thermal solder shock and chemical processing can influence the interface adhesion between the copper foil and the resin without sufficient protection. The electroplating, i.e., treatment, of brass onto the copper foil will provide such protection. However, this process generally involves the production of an intermediate, while very thin, copper oxide layer on the surface of the foil. Other alloy treatments have also been employed to overcome this problem including Cu—Ni and Zn—Cr treatments.

Generally, in electroforming copper to form copper foil and particularly during the treatment of copper foil as described above, a gelatin component is typically used to control roughness and other properties. Under processing conditions organic particulate matter, believed to be derived from the gelatin component, is produced. The organic particulate matter is codeposited with the copper when forming the copper foil or with the metallic layer when treating copper foil. The deposited organic particulate matter leads to defects in laminate boards. It is desirable to have a method of treating copper foil by electrodeposition wherein the organic particulate matter is removed and prevented from depositing in or on the copper foil.

For example, S. E. Afifi et al., "Additive Behavior in Copper Electrorefining," *Journal of Metals*, February, 1987, pages 38–41, discuss the use of organic additives such as gelatin and thiourea in electrodeposition processes.

Knuutila et al., "The Effect of Organic Additives on the Electrocrystallization of Copper," *The Electrorefining of Copper*, examine the behavior of thiourea, animal glue and chloride ions in the electrolysis of copper.

Ibl et al., "Note on the Electrodeposits Obtained at the Limiting Current," *Electrochimica Acta*, 1972, Vol. 17, pages 733–739, disclose the use of thiourea in acid cupric sulfate solutions as a leveling agent.

Franklin, "Some Mechanisms of Action of Additives in Electrodeposition Processes," *Surface and Coatings Technology*, Vol. 30, pages 415–428, 1987, discusses the use of a number of additives in electrodeposition processes, including one for copper.

Various attempts to remove the organic contaminants by such conventional methods as; carbon treatment, peroxide and permanganate conditioning before carbon treatment, electrolytic purification, 0.45 micron filtering, ultrafiltering, and treatment with ion exchange resins have not been found to be successful.

SUMMARY OF THE INVENTION

The invention relates to a process for avoiding contamination on the surface of treated copper foil, comprising the steps of:

(A) applying a voltage across an anode and cathode, wherein the anode and cathode are in contact with an electroplating composition containing a gelatin component;

(B) removing organic particulate matter by contacting the electroplating composition containing the organic particulate matter with an adsorbent polymer; and (C) electrolytically treating the copper foil functioning as the cathode.

The electroplating composition may additionally contain an active sulfur-containing component, such as thiourea.

Further in accordance with the present invention, an essentially contaminant-free conductive copper foil is provided, particularly, a treated copper foil produced from an electrolytic bath comprising organic additives such as animal glue.

Still further in accordance with the present invention, a process of filtering an electroplating composition useful for the treatment of copper foil and comprising organic particulate through an adsorbent material is provided.

These and other aspects of the invention will become apparent to those skilled in the art upon the reading and understanding of the specification.

BRIEF DESCRIPTION OF THE DRAWINGS

The invention will be further described in connection with the attached drawing figures showing preferred embodiments of the invention including specific parts and arrangements of parts. It is intended that the drawings included as a part of this specification be illustrative of the preferred embodiments of the present invention and should in no way be considered as a limitation on the scope of the invention.

DESCRIPTION OF THE PREFERRED EMBODIMENTS

Figure 1:
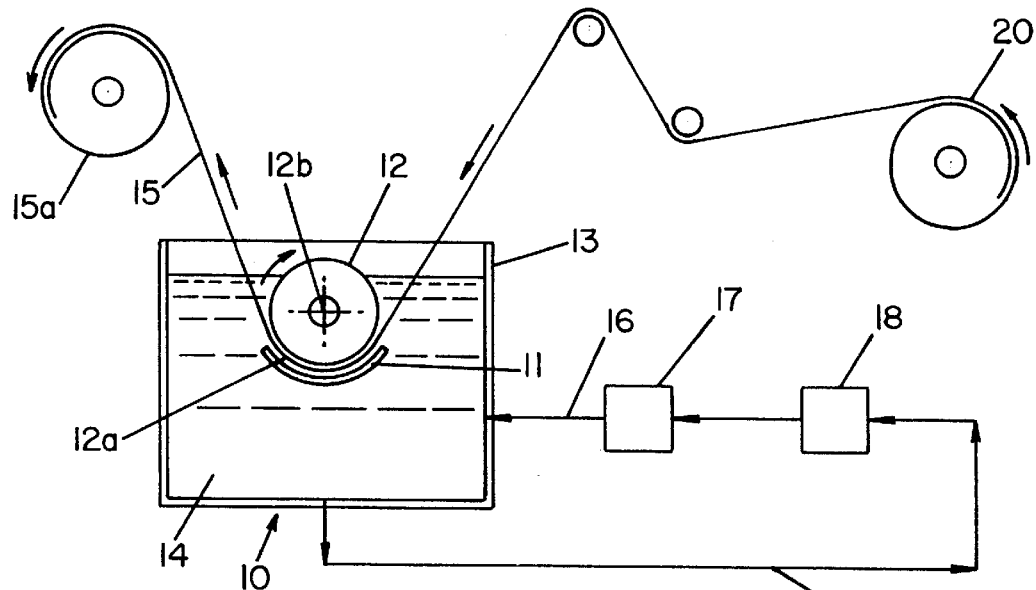
FIG. 1 is a schematic drawing showing one embodiment of the electroplating operation in accordance with the present invention.

The production of copper foil by electroforming processes involves the use of an electroforming cell consisting of an anode and a cathode, an electroforming composition, and a source of current at a suitable potential. When voltage is applied between the anode and cathode, copper deposits on the cathode surface. Copper foil produced by such a process is generally further treated by subjecting the electroformed copper foil to further electrolytic treatment and plating operations for reasons discussed above.

The electroplating composition according to the present invention will contain various electrolytes including such electrolytes as sulfate ions and metallic ions such as copper, zinc, nickel, chromium and the like depending upon the specific metal layer to be electroplated. The electroplating composition may also contain other additives to impart specific properties to the plated foil or to improve the electrolytic process, e.g., lower the required current density for electroplating. Such additives may include a gelatin component, an active sulfur-containing component, chloride ions and the like.

The electroplating compositions according to the present invention will contain a gelatin component. Gelatin components are discussed and defined in the E. H. Chia et al. and S. E. Afifi et al. articles cited above. In general, useful gelatin components are high-protein polymers of amino acids linked by peptide chains, i.e., —CO—NH—, and having molecular weights in the range of from about 10,000 to 300,000. Commonly animal glue is used as the gelatin component because it is relatively inexpensive, commercially available and convenient to handle. Glue is believed to function by adsorbing onto the surface of the copper foil to thus decrease the exchange current density for copper deposition and/or surface treatment.

The electroplating compositions of the present invention may also include an active sulfur-containing component. These compounds are generally characterized as containing a bivalent sulfur having both bonds of the sulfur directly connected to a carbon atom together with one or more nitrogen atoms also connected to the carbon atom. Thioureas, isothiocyanates, thiosinamine (allyl thiourea) and thiosemicarbazide are useful as active sulfur-containing compounds. Preferably, the active sulfur-containing component is thiourea. U.S. Pat. No. 2,563,360 describes a number of such active sulfur-containing components, and the disclosure is hereby specifically incorporated by reference.

In the method of the present invention, the electroplating composition containing metal ions, gelatin components and other such organic particulate matter is contacted with an adsorbent polymer. The adsorbent polymer is a porous polymer capable of removing the organic particulate matter. Generally, the adsorbent polymer is a macroreticular resin. The term "macroreticular" means porous adsorbent in which the pores are larger than the atomic distance and are not part of the polymer structure per se. The pores are microscopic channels resulting from the squeezing out of an organic precipitant from a copolymer mass. The pore structure is not dependent upon environment and, therefore, is retained despite the contact with various concentrations of electrolyte solutions. An advantage of a macroreticular polymer is that such a polymer is capable of withstanding large osmotic pressure variations commonly encountered in cyclic processes.

The macroreticular substrate polymers are lightly cross-linked copolymers of 1) a polyunsaturated monomer, containing a plurality of non-conjugated double bonds, which act as cross-linking agents, and 2) a monoethylenically unsaturated monomer. In one embodiment, at least one of the polyunsaturated or monoethylenically unsaturated monomers is aromatic, and preferably both are aromatic, provided that the major proportion of the copolymer (at least 50% by weight) is aromatic. The preferred polyunsaturated monomers include divinylbenzene, trivinylbenzene and the like. The preferred monoethylenically unsaturated monomers include styrene, ortho, meta or para methylstyrenes; ortho, meta or para ethylstyrenes; ethylvinylbenzene, vinyl naphthalene and vinyl toluene. The monomers may include heterocyclic compounds such as divinylpyridine. Among the useful aliphatic polyunsaturated monomers include diacrylates and dimethacrylates, such as ethyleneglycol diacrylates, ethyleneglycol, dimethacrylates, trimethylolpropane trimethacrylate, neopentylglycol dimethacrylate, divinyl ketone, divinyl sulfide, allylacrylate, diallylmaleate, diallyl fumarate and the like. Useful monoethylenically unsaturated aliphatic monomers include esters of acrylic acid, such as methyl, ethyl and propyl acrylate, and corresponding esters of methacrylate acid, or in the esters contain 1 to about 10 carbon atoms. In one embodiment, the macroreticular resins have a pore diameter of 80 angstroms and a bead density of 1.05 g/ml.

Macroreticular resins, such as AMBERLITE® XAD-16 and XAD-7 macroreticular resins are available commercially from Rohm & Haas. Macroreticular resins are known to those in the art and are described in U.S. Pat. No. 3,991,017 issued to Barrett et al., U.S. Pat. No. 4,486,313 issued to Meitzner et al., and U.S. Pat. No. 4,224,415 issued to Meitzner et al. The disclosures of these references specifically related to the above-described macroreticular resins are hereby incorporated by reference.

The gelatin component, preferably animal glue, may be added to the electroplating composition of the present invention during electrodeposition at addition rates ranging from about 0.5 milligram of glue per minute per 1000 amperes (mg/min·kA) up to about 11 mg/min·kA. The process generally is conducted at a temperature of about 60 degrees centigrade (°C.) using a current density between about 200 amperes per square foot (ASF) and about 1400 ASF. Electrolyte flow is maintained so that plating occurs below the mass transfer limited current density. In such process, the glue addition rate may be varied to vary the metallurgical properties of the copper foil and/or the metallic layer be plated on the copper foil in order to meet various performance criteria. Typical matte side roughnesses ($R_{tm}$) of copper foils produced by this method, as measured on a SURFTRONIC® 3 profilometer (Rank Taylor Hobson Ltd.—Leicester, England), range from about 4.75 $\mu$m to about 8 $\mu$m for ½ oz. copper foil; from about 6.5 $\mu$m to about 10 $\mu$m for 1 oz. copper foil; and from about 8.75 $\mu$m to about 15 $\mu$m for 2 oz. copper foil. For example, IPC Class 1 foils may be produced by this method at glue addition rates between 5 and 11 mg/min·kA while IPC Class 3 foils may be produced at glue addition rates less than 5 mg/min·kA. Low profile (low roughness) foils could be produced by increasing the glue addition rate to above 11 mg/min·kA.

An electroplating operation conducted in accordance with the invention may be carried out in an electroplating system of the manner depicted schematically in FIG. 1 of the drawings. The system includes an electroplating cell 10 that comprises an anode 11, a cathode drum 12, an electroplating composition tank 13 and an electrolyte solution 14 contained in tank 13 and in which anode 11 and cathode 12 are suitably submerged.

Solution 14 contains suitable electrolytes for the plating operation including a gelatin component and optionally an active sulfur containing component and means for applying an electrical current between anode 11 and cathode 12 are provided, in a manner that is well known in the art. Thus, metal ions in solution 14 gain electrons at the peripheral surface 12a of cathode drum 12 wherein a previously formed copper foil substrate 20 functions as the cathode surface and is advanced through the electrolyte by drum 12 whereby the specific metal plates out in the form of a metallic layer 15. Untreated copper foil 20 is fed to cathode drum 12 which rotates continuously about its axis 12b during the process and metallic layer 15 is continuously electrodeposited upon surface 12a. Thus, from electroplating cell 10, a continuous electroplated metallic layer is plated on copper foil surface 12a and is taken up into roll 15a.

In the present invention, the electroplating composition is passed through an adsorbent polymer 18 by line 16. Optionally, the electroplating composition may pass through filter 17. Organic particulate matter is removed in the adsorbent polymer 18 and returned to the electroplating composition by line 19.

Figure 2:
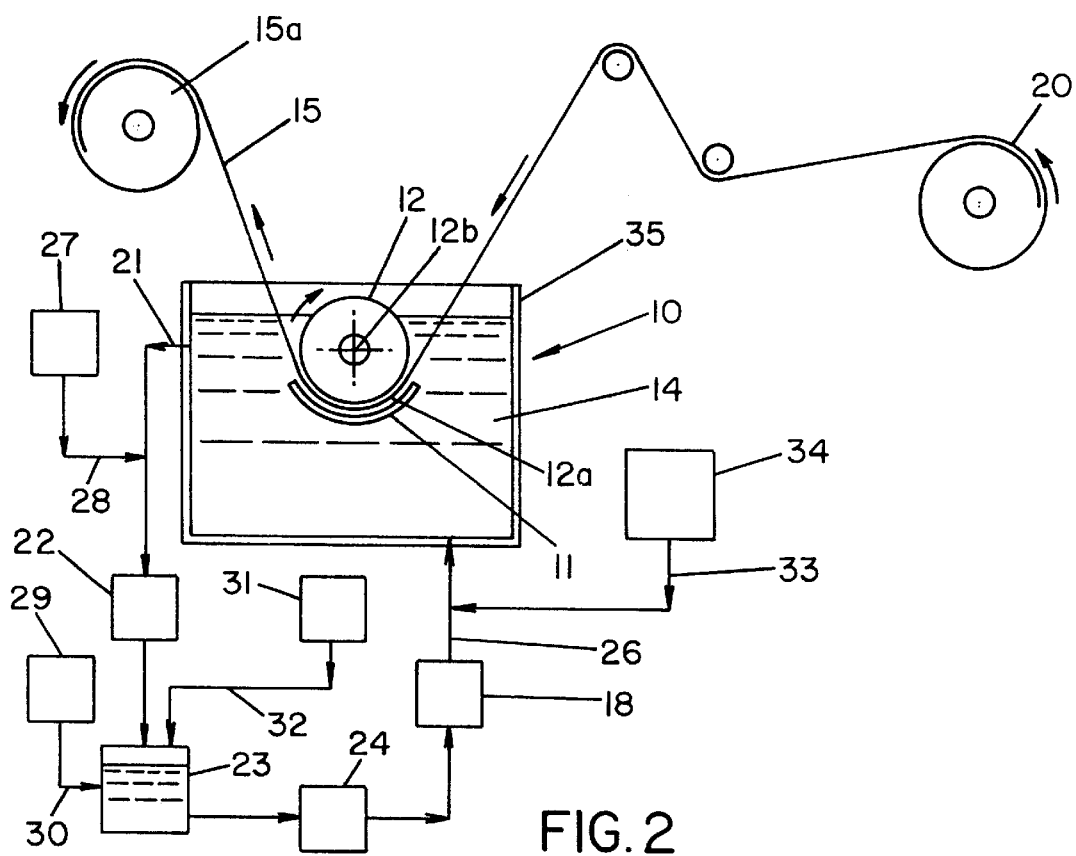
FIG. 2 is a schematic drawing of a preferred embodiment of a continuous electroplating process in accordance with the present invention.

The process of FIG. 1 depletes the electrolyte solution of metal ions, sulphate ions, the gelatin component and, optionally the active sulfur-containing component. In a preferred embodiment, the process is preferably a continuous process and the components of the electroplating composition must be continuously replenished. A continuous process of electroplating a dendritic copper layer onto a previously produced electroformed copper foil is illustrated in FIG. 2. To this end, electrolyte composition 14 is withdrawn through line 21 and recirculated through a filter 22, a digester 23, another filter 24, adsorbent polymer 18, and then is reintroduced into tank 35 through line 26. Sulfuric acid from a source 29 is fed into digester 23 through line 30 and metallic copper from a source 31 is introduced into digester 23 as indicated schematically along the path 32. Metallic copper is digested by sulfuric acid to form copper ions in digester 23. Copper foil 20 is fed to drum 12 to function as the cathode 12a. The continuous replenished electrolyte composition 14, as described above, provides copper ions to cathode surface 12a to form the desired dendritic layer 15. The, thus treated copper foil is taken up on drum 15a.

Make-up gelatin component is added to the recirculating solution in line 21 from a source 27 through a line 28; and, in accordance with the invention, the active sulfur containing component is added to the recirculating solution in line 26 through line 33 from a source 34. The sulfur containing component is preferably introduced into the recirculating solution at a point as near to the tank 35 as possible to minimize decomposition of the active sulfur containing component by the highly acidic recirculating fluid existing from digester 23.

Generally speaking, in commercial applications it is difficult, if not impossible, to avoid the presence of chloride ions in the electrolyte solution. In this regard, it should be noted that chloride ion is a common contaminant in water and in bulk ingredients. And since the chloride ion concentration has an effect on the properties of the electroplated foil it is desirable to control the chloride ion concentration at a known level to eliminate the uncertainties that would be involved if the chloride ion concentration were to fluctuate unpredictably. The chloride ion content in the electrolyte solution may be controlled by devices that are well known and conventionally employed by those of ordinary skill in the art.

The concentrations of the active sulfur containing component and the gelatin component in the electrolyte solution may preferably be expressed in terms of the steady state consumption rate thereof. These ingredients act at the surface of the copper foil as it forms and/or plated onto the surface of the foil and are consumed by the reactions which occur there. Furthermore, these reactions affect the internal regions as well as the external surfaces of the foil and thus have a modifying effect on tensile strength, ductility and elongation in addition to surface roughness.

The consumption rate is determined by the concentration of each ingredient in the electrolyte solution and this is determined by the amount of each ingredient that is added to the electrolyte solution during steady state operation. The addition rate may be expressed in terms of weight added per unit of time per unit of current flow. Conveniently, the addition rate of the active sulfur containing component and of the gelatin component may be defined as milligrams added to the electrolyte solution per minute per one thousand amperes (mg/min·kA).

As set forth above, to electroplate a metallic layer onto, i.e., to treat, copper foil electrolytically, a voltage is imposed between an anode and a cathode immersed in a copper or other metallic ion containing electrolytic bath solution. Copper, e.g., is electrodeposited on the cathode surface, i.e., the copper foil, in the form of a thin metal film. The qualities and characteristics of the metal film are a function of many parameters such as current density, temperature, substrate material, solution agitation and electrolyte solution composition. Additives are generally added to the electrolyte solution so that the electrodeposit may be formed with certain desired qualities, one such quality being a certain controlled roughness. Without the presence of additives, the copper deposits have the tendency, as a result of crystalline imperfections and grain boundaries, to grow with an uncontrolled roughness that is not uniform. Additionally, a certain controlled degree of roughness is often desired by the copper foil user in order that the bond strength is increased between the copper foil and the dielectric support to which the copper foil is adhered. Roughness contributes to the strength of the bond by increasing the surface area available for bonding.

As a preferred embodiment, a dendritic copper layer is electroplated onto a copper foil in accordance with the process depicted in FIG. 2. For a typical electroplating process of this nature, centerline particle counts (organic particulate) of as high as 100 or more are obtained. The process according to the present invention, particulate counts in the range of 2.5 to about 5.5 were obtained. In general, it was found that the process of the present invention would result in at least about 75% reduction in proteinaceous material detected on the treated copper foil with reduction of 80% or greater obtained in some instances.

It is conventional to bond the matte side of the electrodeposited foil to a dielectric substrate so that the shiny side of the foil faces outwardly from the laminate. In a commercial sense, useful dielectric substrates may be prepared by impregnating woven glass reinforcement materials with partially cured resins, usually epoxy resins. Such dielectric substrates are commonly referred to as prepregs. In preparing laminates, it is conventional for both the prepreg material and the electrodeposited copper foil material to be provided in the form of long webs of material rolled up in rolls. The rolled materials are drawn off the rolls and cut into rectangular sheets. The rectangular sheets are then laid-up or assembled in stacks of assemblages. Each assemblage may comprise a prepreg sheet with a sheet of foil on either side thereof, and in each instance, the matte side of the copper foil sheet is positioned adjacent the prepreg so that the shiny sides of the sheets of foil face outwardly on each side of the assemblage.

The assemblage may be subjected to conventional laminating temperatures and pressures between the plates of laminating presses to prepare laminates comprising sandwiches of a sheet of prepreg between sheets of copper foil.

The prepregs used conventionally in the art may consist of a woven glass reinforcement fabric impregnated with a partially cured two-stage resin. By application of heat and pressure, the matte side of the copper foil is pressed tightly against the prepreg and the temperature to which the assemblage is subjected activates the resin to cause curing, that is cross linking of the resin and thus tight bonding of the foil to the prepreg dielectric substrate. Generally speaking, the laminating operation will involve pressures in the range of from about 250 to about 750 psi, temperature in the range of from about 350° to 450° F. and a laminating cycle of from about 40 minutes to about 2 hours. The finished laminate may then be utilized to prepare printed circuit boards.

Conductive foils for printed circuit board applications are conventionally treated, at least on the matte side, for enhanced bonding and peel strength between the matte side and the laminate. Typically, the foil treatment involves treatment with a bonding material to increase surface area and thus enhance bonding and increase peel strength. The foil may also be treated to provide a thermal barrier, which may be brass, to prevent peel strength from decreasing with temperature. Finally, the foil may be treated with a stabilizer to prevent oxidation of the foil. These treatments are well known and further description thereof is not necessary at this point.

While the invention has been explained in relation to its preferred embodiments, it is to be understood that various modifications thereof will become apparent to those skilled in the art upon reading the specification. Therefore, it is to be understood that the invention disclosed herein is intended to cover such modifications as fall within the scope of the appended claims.

I claim:

1. A process for electrolytic treatment of copper foil, comprising the steps of;

(A) applying a voltage across an anode and cathode, wherein the anode and cathode are in contact with an electroplating composition containing a gelatin component;

(B) removing organic particulate matter by contacting the electroplating composition containing the organic particulate matter with a macroreticular resin; and (C) electrolytically treating said copper foil.

2. The process of claim 1, wherein the organic particulate matter is proteinaceous.

3. The process of claim 1, wherein the organic particulate matter is derived from the gelatin component.

4. The process of claim 1, wherein the gelatin component is glue.

5. The process of claim 1, wherein the electroplating composition further comprises sulfate ions.

6. The process of claim 1, wherein the electroplating composition further comprises an active sulfur-containing component.

7. The process of claim 6, wherein the active sulfur-containing component is thiourea.

8. The process of claim 1, wherein steps (B) and (C) occur simultaneously.

9. The process of claim 1, wherein step (B) further comprises filtering the electroplating composition containing the organic particulate matter.

* * * * *